United States Patent [19]

Gevelber et al.

[11] Patent Number: 4,857,278
[45] Date of Patent: Aug. 15, 1989

[54] CONTROL SYSTEM FOR THE CZOCHRALSKI PROCESS

[75] Inventors: Michael A. Gevelber, Belmont; George Stephanopoulos, Winchester, both of Mass.

[73] Assignee: Massachusetts Institute Of Technology, Cambridge, Mass.

[21] Appl. No.: 72,554

[22] Filed: Jul. 13, 1987

[51] Int. Cl.$^4$ ............................................. C03B 15/26
[52] U.S. Cl. .................................. 422/249; 422/106; 422/109; 422/114; 156/601; 156/617.1
[58] Field of Search ............... 422/106, 109, 114, 249; 156/601, 617 SP, 617.1

[56] References Cited

U.S. PATENT DOCUMENTS

| | | | |
|---|---|---|---|
| 3,206,286 | 9/1965 | Bennett et al. | 156/601 |
| 3,291,650 | 12/1966 | Dohmen et al. | 156/601 |
| 3,692,499 | 9/1972 | Andrychuk | 156/617 SP |
| 3,998,598 | 12/1976 | Bonora | 156/601 |
| 4,058,429 | 11/1977 | Duncan et al. | 156/601 |
| 4,565,598 | 1/1986 | Seymour | 156/601 |
| 4,617,173 | 10/1986 | Latka | 422/249 |

FOREIGN PATENT DOCUMENTS

| | | | |
|---|---|---|---|
| 0104559 | 4/1984 | European Pat. Off. | 156/617 SP |
| 60-251194 | 12/1985 | Japan | 156/601 |

OTHER PUBLICATIONS

Hurle, Control Of Diameter In Czochralski And Related Crystal Growth Techniques, *Journal of Crystal Growth*, 42 (1977) pp. 473-482.
J. M. Quenisset et al., "Automation of a Vertical Zone Melting Apparatus" Journal of Crystal Growth 30 (1975) 169-176. (English Translation).
D. T. Hurle, J. Cry, Growth, 85 (1987) 1.
C. E. Garcia and M. Morari, I&EC Proc. Des. Dev., 21(1982)308.
G. Stephanopoulos and H-P Huang, "The 2-Port Control System", 1986.
G. Stein and M. Athans, LIDS-P-1384, MIT (1984).
W. Bardsley et al., J. Cry. Growth, 40(1977)13, 40(1977)21.
U. Gross and R. Kersten, J. Cry. Growth, 15(1972)85.
K. J. Gartner et al., J. Cry. Growth, 13/14(1972)619.
S. Ozawa and T. Fukuda, J. Cry. Growth, 76(1986)323.
T. G. Digges Jr. et al., J. Cry. Growth, 29(1975)326.
Kaytex-Hamco Co., CG3000 Crystal Growing System Manual.
S. Motakef, ASME J of Heat Transfer, submitted 1987.
U. Ekhult and T. Carlberg, J. Cry. Growth, 76(1986)317.
A. S. Jordan et al., J. Cry. Growth, 70(1984)555.
A. G. Elliot et al., J. Cry. Growth, 70(1984) 169.
Crystal Res. Technol., 21 9 1986, p. 1125.
J. Cry. Growth, 65 1983, p. 278.
J. Cry. Growth, 10 1971, p. 133.
J. Cry. Growth, 76 1986, p. 395, 75 1986, p. 227.
D. F. O'Kane et al., J. Cry. Growth, 13/14 (1972) 624.

*Primary Examiner*—Robert L. Stoll
*Assistant Examiner*—Robert M. Kunemund

[57] ABSTRACT

The control system includes a master loop for controlling crystal interface diameter and slave control loops for controlling the melt and the crystal thermal environment. Diameter and meniscus angle signals are partitioned into both a low frequency and a high frequency signal. The low frequency signal is used to adjust the set point of the melt. The higher frequency signal is used to control the crystal pull rate. The crystal control slave loop regulates crystal heat flux which may include following a heat flux trajectory. The heat flux trajectory may also be used to adjust the melt temperature set point.

12 Claims, 2 Drawing Sheets

CONTROL SYSTEM FOR THE CZOCHRALSKI PROCESS

The Government has rights in this invention pursuant to Grant Number F33615-83-C-5089 awarded by the Department of the Air Force.

BACKGROUND OF THE INVENTION

This invention relates to control systems for growing crystals by the Czochralski technique Control schemes used in the Czochralski process are typically a combination of feedforward control and closed loop regulators. For controlling the growth dynamics, the only feedback control has been automatic diameter control. Other objectives are achieved in a feedforward manner, using empirically developed input trajectories. Typical feedforward control inputs include selection of crucible and seed rotation trajectories to alter segregation behavior and use of pull rate and power input trajectories to obtain the desired crystal shape and seeding conditions (necking) to reduce grown-in dislocations.

A single input-single-output (SISO) feedback loop is typically used to implement the diameter control, which is sometimes subject to a constraint such as maintaining a desired pulling rate. The diameter error signal is determined from either a weight signal, imaging of the meniscus area, or direct observation by TV or x-ray imaging. System inputs include pull rate and crucible heater power, although several inputs for the meniscus region have been reported. Local closed loop SISO regulators are also employed to maintain desired rotation rates, heater temperatures, and lift rate of the crystal growing system.

The conventional approach to Czochralski systems control has performed adequately for elemental semiconductors such as silicon (Si). However, the increased electronic materials requirements for Si VLSI and ULSI devices and the difficulties in achieving desirable properties for compound semiconductors such as gallium arsenide (GaAs) and indium phosphide (InP), indicates the necessity of developing an improved control strategy.

The coupled nature of the Czochralski process and the material properties of the semiconductor material determine the crystal quality that is achieved. The important coupled process phenomena which determine the resulting dislocation and segregation characteristics of semiconductors include the thermal fluid characteristics of the melt, the interface region's mass and heat transfer, and the thermal stresses in the crystal. As larger crystals are grown, the significance of the different phenomena vary. The problems are especially significant in the growth of compound semiconductor systems, but are also important in other systems such as oxides and elemental semiconductors.

The diameter control structures typically used differ in terms of the measurements and inputs they use. Typical structures include: feedback to heat input, feedback to pull rate input, and feedback to pull rate input kept within bounds by manipulating the heater power. Satunkin and Rossoleuko developed a closed loop diameter control manipulating both pull rate and input power, CRYSTAL RES. TECHNOL., 21 9 1986, p. 1125. They solved the underspecified problem of using two inputs to maintain one output by formulating it as an optimal control problem. The analysis, however, did not include the batch disturbances. Other heat inputs have been studied. Ekhult and Carlberg, J. CRY. GROWTH, 76 1986, p. 317, used infrared heaters to control the meniscus heat transfer using a diameter feedback control structure. Brice et al., J. CRY. GROWTH, 10 1971 p. 133, used cooling jets to overcome heat transfer limitations for crystals that are transparent at infrared frequencies and also reflectors over the melt surface. Srivastava et al., J. CRY. GROWTH, 76 1986, p. 395, has extended the analysis of using jet by examining the radiative and convective heat transfer around the interface region.

While it is generally recognized that the interface shape affects the crystal quality, only limited work has been reported in terms of an active control of the interface shape design. Srivastava has studied the steady-state relation between cooling jets, diameter, and $\delta H$, the difference in height between interface and melt. Derby and Brown, J. CRY. GROWTH, 75 1986 p. 227, have reported a method to calculate the required feedforward inputs to maintain the desired interface diameter, $R_i$, and interface deflection. A limitation to implementing feedforward schemes is that the modelled interface shape is highly dependent on boundary assumptions and therefore is subject to significant modelling error. A feedback scheme will therefore be required to achieve the desired performance. Since disturbances enter both from the crystal and the melt, the interface shape control scheme must be able to correct for both types of heat flux disturbances.

Several researchers have reported the measurement of the melt and crystal temperature distributions, but do not specify how these measurements should be used in the control structure and law. While it is also recognized that the system is time varying, only limited attention has been given to the control design requirements to compensate for the variation. One solution that has been used is to utilize an empirically based open loop feedforward input for either the power or pull rate.

The shortcomings of the conventional control design approach are that (a) the specification of the closed loop control objectives does not explicitly consider the effects of other important process characteristics on the crystal quality, (b) the conventional control structure design does not address the batch disturbances effects, and (c) only limited consideration has been given to the relation between the choice of output variables, measurements, inputs, and controller performance.

SUMMARY OF THE INVENTION

Generally, the apparatus for controlling crystal growth from a melt includes a sensor responsive to crystal diameter. A filter partitions the signal from the diameter sensor into a high frequency signal and a low frequency signal. A crystal puller responds to the high frequency signal to withdraw the crystal from the melt. The low frequency signal adjusts the melt temperature set point of the melt heater. In this way, the crystal diameter and crystal/melt interface shape are controlled. In one embodiment, the melt meniscus angle is estimated and this information is used both in the diameter master control loop and in the melt control loop, extending the bandwidth.

In yet another aspect of the invention, a crystal thermal environment slave control loop is provided to control thermal flux from the crystal during growth, to compensate for the crystal heat flux disturbance and meet the thermal requirements related to the thermal stress dislocation formation. In yet another aspect of the invention, a melt height estimate or measurement is used to generate feedforward input for the melt slave loop to compensate for batch disturbance.

In a preferred embodiment, the diameter related measurements are filtered by a low pass filter to pass the low frequency signal to the melt slave controller and a band pass filter to pass the high frequency signal to determine the crystal pull rate. The lowest frequency of the band pass filter is selected to be above the frequency of the low pass filter. The highest frequency of the band pass filter is selected to be below the frequency of the crystal slave control loop to prevent coupling to the other loops and it can also be set to avoid adverse growth rate variations. A saturation element limits the maximum puller velocity to minimize growth variations that could cause adverse segregation effects.

The control system according to the present invention automatically adjusts the heaters and pullers of the system to maintain the desired crystal diameter, to coordinate the control of the crystal heat flux with the interface and melt control so as to limit dislocation formation while at the same time maintaining the conditions that achieve the desired segregation behavior and bulk shape. The system can also maintain the desired melt conditions and interface shape to meet the desired segregation characteristics and prevent dislocations from being formed at the interface and maintains a desired axial thermal gradient in the melt to avoid constitutional supercooling and to maintain the desired growth rate.

DESCRIPTION OF THE PREFERRED EMBODIMENT

Figure 1:
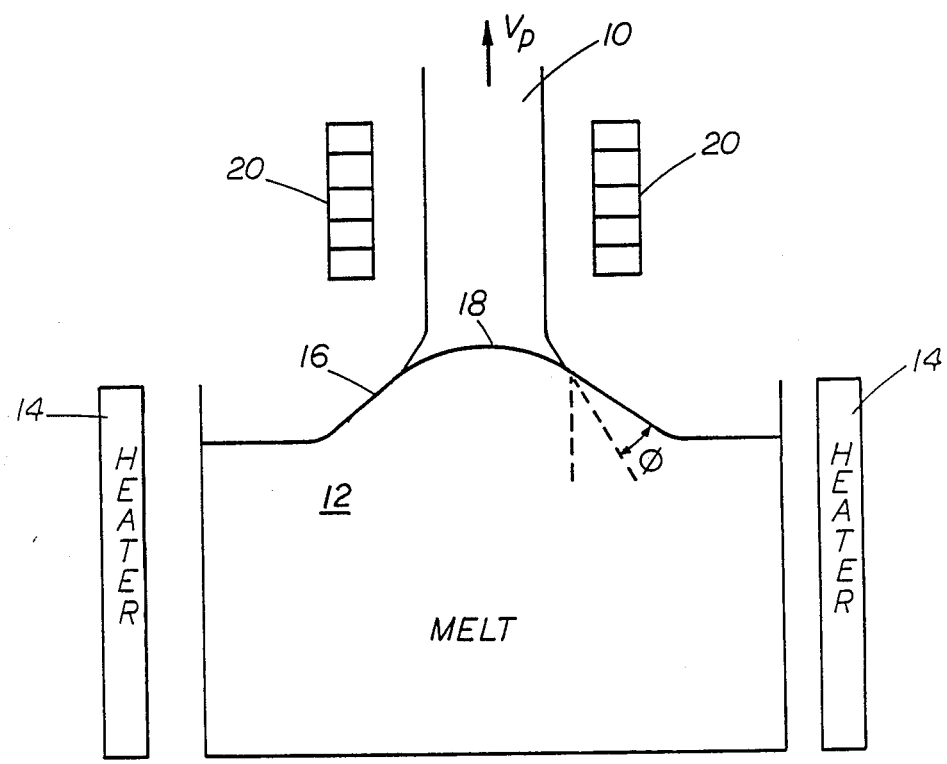
FIG. 1 is a cross sectional view of apparatus for growing crystals by the Czochralski process.

With reference first to FIG. 1, a crystal 10 is being grown by the Czochralski process. The present invention is designed for materials such as gallium arsenide, silicon, germanium and other crystal types. During the growing process, the crystal 10 is pulled from a melt 12 by a puller (not shown) whose velocity is controllable. For some materials, such as GaAs, a liquid encapsulation layer is used above the melt. The temperature of the melt 12 is controlled by a heater 14 which surrounds the melt. The heater may include a heat pipe, segmented heaters, or a bottom heater. As the crystal is pulled from the melt a meniscus region 16 forms at an angle $\phi$. An interface region 18 between the crystal and the melt also forms. A coaxial structure 20 surrounds the crystal and regulates the heat flux from the crystal 10. The structure 20 may be a heat pipe or segmented heaters. The structure 20 can extend into the melt 12, or be above the melt, but is not shown this way in FIG. 1 for the sake of clarity. The control system of the invention controls the puller velocity and heaters to produce the desired crystal attributes discussed above.

Figure 2:
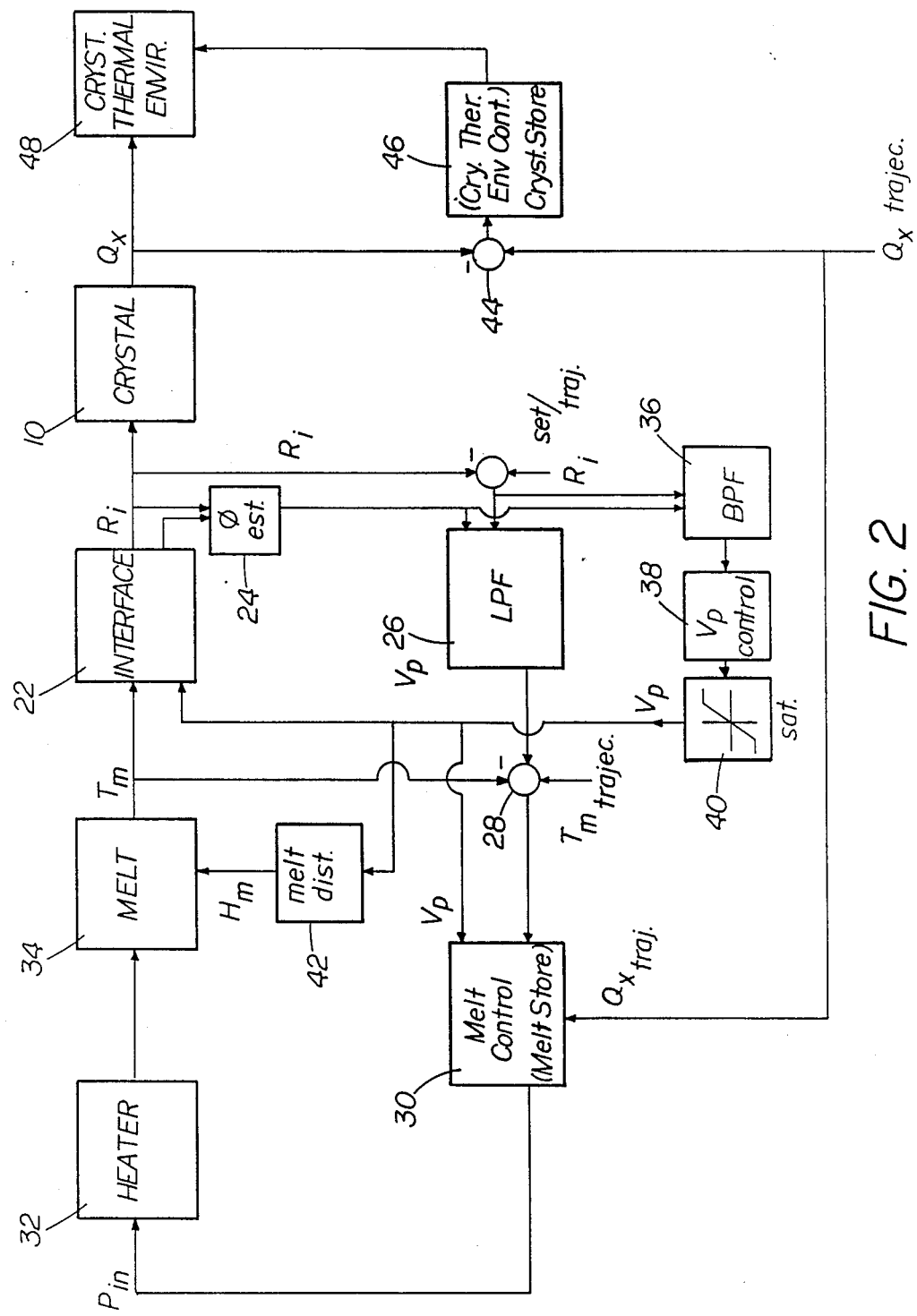
FIG. 2 is a block diagram of the control system of the present invention.

The control system of the invention is shown in FIG. 2. The crystal diameter $R_i$ is measured at interface block 22. Diameter may be measured by known optical sensing devices. Alternatively, diameter can be inferred from the weight of the crystal. The meniscus angle $\phi$ shown in FIG. 1 is estimated in an estimator 24. The angle $\phi$ can be estimated by several known measurement and estimation procedures. For example, $\phi$ can be estimated from a meniscus shape equation and the measurement of the crystal diameter at the interface and from the height of the interface above the melt level. The angle $\phi$ is important in that it provides information proportional to the time derivative of the diameter, $\dot{R}_i$.

The diameter signal $R_i$ and the meniscus angle estimate $\phi$ are filtered by low pass filter 26. The output of the low pass filter 26 adjusts the melt set point $T_m$ at a summing node 28. The output of the node 28 enters a melt control or melt slave element 30 which controls the power into a heater 32 which in turn heats the melt 34.

The diameter signal $R_i$ and the meniscus angle estimate $\phi$ also enter a band pass filter 36 for controlling the velocity $V_p$ of the crystal puller discussed above in conjunction with FIG. 1. The lower frequency of the band pass filter 36 is set above the low pass filter 26 break frequency to prevent coupling to the melt control loop. The upper limit of the band pass filter 36 is set below that of the crystal loop to be discussed below to limit coupling and can be adjusted to prevent adverse segregation effects. The output of the band pass filter 36 passes through a puller velocity control element 38 and through a saturation element 40 which limits the maximum $V_p$ variations to a level that prevents adverse segregation effects. The output of the saturation element 40 adjusts the crystal pull rate to regulate interface diameter and shape. The $V_p$ signal also enters a melt adjust block 42 which utilizes a melt height $H_m$ estimate or measurement to generate feedforward input to compensate for batch disturbances before they cause error.

The heat flux $Q_x$ from the crystal 10 is compared with a desired $Q_x$ trajectory at a node 44 and used by a crystal slave controller 46 to control the crystal thermal environment represented by a block 48. In particular, the heat pipe or segmented heaters 20 are controlled to regulate the crystal thermal environment. The $Q_x$ trajectory signal also enters the melt control element 30 to generate a feedforward input for the melt loop to compensate for the time variation of the $Q_x$ trajectory that would otherwise change the interface heat balance. The melt control element 30 utilizes a model based compensator (MBC) which incorporates a model of the melt to provide feedforward control that compensates for the melt's time varying eigenstructure. A model of the melt height related disturbance is also incorporated to provide feedforward control. Either a melt setpoint or a trajectory can be used to drive the system.

The closed loop regulator structure of this invention maintains interface growth dynamics and compensates for the batch related disturbances before they affect the growth dynamics. The control structure incorporates a master loop based on the measurement of the interface dynamics and slave loops around the melt and crystal. The crystal environment slave loop is used to eliminate the crystal heat flux disturbance and to meet the crystal heat transfer control objectives for crystal growth.

The interface master loop and melt slave loop utilize the diameter error which is partitioned into low and high frequency error signals. The low frequency diameter error is used to determine the melt loop set point adjustment, using the heater input. The higher frequency error is fed back using the pulling rate input. The melt slave loop maintains the melt at the desired set point, attenuating the melt heat flux disturbance before it affects the interface. The melt slave loop uses feedforward control related to the melt height in order to compensate for batch disturbances. The low frequency error signal insures that plant model errors (such as time variations of the process parameters which include heat transfer coefficient and unmodelled disturbances) are corrected.

Using the pull rate input, feedback of the high frequency error extends the bandwidth of the system. Since this loop operates at frequencies higher than the heater-melt bandwidth, it will not interfere significantly with the melt loop. If required, a high pass filter can be added to the pull rate loop to reduce cross coupling. The pull rate loop does not incorporate a disturbance feedforward component since this would entail operating at frequencies where there are significant modelling errors which would pose robustness problems.

What is claimed is:

1. Apparatus for controlling crystal growth from a melt comprising:
   a sensor responsive to crystal diameter;
   an estimator adapted to generate an estimate of melt meniscus angle;
   a first filter adapted to partition the signal from the diameter sensor and the estimator into a high frequency signal and a second filter adapted to partition the signal from the diameter sensor and the estimator into a low frequency signal;
   a puller responsive to the high frequency signal for withdrawing the crystal from the melt; and
   a melt heater responsive to the low frequency signal to adjust the melt temperature;
   whereby the crystal diameter and crystal/melt interface shape are controlled.

2. The apparatus of claim 1 further including crystal heating apparatus adapted to adjust crystal heat flux.

3. The apparatus of claim 2 including a crystal control loop to regulate crystal heat flux.

4. The apparatus of claim 1 including apparatus for measuring melt height for adjusting the melt temperature.

5. The apparatus of claim 1 or claim 3 wherein the filter comprises a low pass filter to pass the low frequency signal and a band pass filter to pass the high frequency signal.

6. The apparatus of claim 5 wherein the lowest frequency of the band pass filter is above the frequency of the low pass filter.

7. The apparatus of claim 5 wherein the highest frequency of the band pass filter is below the frequency of the crystal control loop.

8. The apparatus of claim 1 including a saturation element to limit crystal withdrawal rate.

9. Apparatus for regulating melt temperature comprising:
   a sensor responsive to crystal diameter;
   an estimator adapted to generate an estimate of melt meniscus angle;
   a first filter adapted to pass a low frequency component of the signal from the diameter sensor and the estimator and a second filter adapted to partition the signal the high frequency signal from the diameter sensor and the estimator;
   apparatus for measuring melt height;
   apparatus responsive to crystal heat flux;
   apparatus responsive to melt temperature; and
   a control loop responsive to the low frequency signal from the filter, to melt height, to crystal heat flux, and to melt temperature to regulate melt temperature.

10. The apparatus of claim 9 wherein the temperature is a trajectory.

11. The apparatus of claim 1 wherein crystal diameter is controlled to follow a trajectory.

12. The apparatus of claim 3 wherein the crystal heat flux is controlled to follow a trajectory.

* * * * *